United States Patent
Olsen et al.

(10) Patent No.: US 6,313,466 B1
(45) Date of Patent: Nov. 6, 2001

(54) METHOD FOR DETERMINING NITROGEN CONCENTRATION IN A FILM OF NITRIDED OXIDE MATERIAL

(75) Inventors: Christopher S. Olsen, Newark; Subhas Bothra, San Jose, both of CA (US)

(73) Assignee: Philips Electronics North America Corp., New York, NY (US)

( * ) Notice: Subject to any disclaimer, the term of this patent is extended or adjusted under 35 U.S.C. 154(b) by 0 days.

(21) Appl. No.: 09/310,470

(22) Filed: May 12, 1999

(51) Int. Cl.$^7$ .............................................. H01L 21/3205
(52) U.S. Cl. ........................................ 250/372; 250/336.1
(58) Field of Search ................................. 250/336.1, 372

(56) References Cited

U.S. PATENT DOCUMENTS 4,905,170 * 2/1990 Forouhi et al. .................... 364/556
6,107,174 * 8/2000 Hori ..................................... 438/585

\* cited by examiner

*Primary Examiner*—Constantine Hannaher
*Assistant Examiner*—Otilia Gabor
(74) *Attorney, Agent, or Firm*—Martine & Penilla, LLP

(57) ABSTRACT

In a method for determining the nitrogen concentration in a film of nitrided oxide material formed over a semiconductor wafer during fabrication of a semiconductor device an optical property of the film of nitrided oxide material is determined. The determined optical property is used to determine the nitrogen concentration in the film of nitrided oxide material. In one embodiment the optical property, e.g., extinction coefficient, k, is correlated to the nitrogen concentration measured by secondary ion mass spectroscopy. In a method of making a semiconductor device a film of nitrided oxide material is formed over a plurality of semiconductor wafers in a fab. The nitrogen concentration in the film of nitrided oxide material is monitored by periodically subjecting one of the wafers to an in-line test in the fab.

22 Claims, 5 Drawing Sheets

METHOD FOR DETERMINING NITROGEN CONCENTRATION IN A FILM OF NITRIDED OXIDE MATERIAL

BACKGROUND OF THE INVENTION

The present invention relates generally to semiconductor devices and, more particularly, to a method for determining the concentration of nitrogen in a film of nitrided oxide material formed over a semiconductor wafer during fabrication of a semiconductor device.

Spurred by the demand for smaller and faster devices, the semiconductor industry has shifted to the use of thinner gate oxides to increase the speed of semiconductor devices. Thinner gate oxides are problematic, however, because they are susceptible to hot electrons and to the diffusion of materials through the oxide into the channel area of the gate. In 0.25 μm and 0.20 μm generation semiconductor devices, e.g., CMOS transistors, nitrogen has been added to thin silicon dioxide gate oxides having a thickness of, e.g., about 50 angstroms, to improve the quality of these devices.

FIG. 1 is a schematic cross-section of a conventional MOS transistor in which source/drain regions 102 are formed in semiconductor substrate 100, which is typically silicon. Polysilicon gate 104, which is separated from substrate 100 by gate oxide 106, extends over the channel region of the MOS transistor. When nitrogen is added to gate oxide 106, which is typically silicon dioxide, the nitrogen incorporates at the silicon/silicon dioxide interface between substrate 100 and gate oxide 106. The formation of Si—N bonds at the interface increases the strength of the interface because Si—N bonds are stronger than Si—O bonds. This increased strength due to the presence of nitrogen increases the resistance of the gate oxide to hot electrons and thereby improves the hot carrier lifetime of the gate oxide. The presence of nitrogen also reduces the diffusion of, e.g., boron, through the oxide into the channel area of the gate.

In commercial production in a fab environment, nitrided gate oxides may be formed by growing a thin film of silicon dioxide having a thickness of, e.g., about 40 angstroms in the presence of NO or other suitable nitric species, e.g., $N_2$, $NH_3$, and $N_2O$. At present, quantitative characterization of the nitrogen at the interface is limited to secondary ion mass spectroscopy (SIMS) because of the small number of nitrogen atoms in the thin gate oxide. Determining the nitrogen concentration in nitrided silicon dioxide films using the SIMS technique is undesirable, however, for at least four reasons. First, the SIMS technique is expensive (about $400 per wafer) and requires a long measurement time per wafer. Second, the SIMS technique is destructive, i.e., each wafer that is tested is destroyed. Third, the area of a wafer that can be tested by the SIMS technique is very small. Fourth, it is impractical to use the SIMS technique in a fab environment.

In light of the problems associated with the SIMS technique, the nitrogen concentration in nitrided gate oxides being commercially produced in fab environments is not being monitored frequently. Before high-volume production begins, SIMS testing is performed to determine the nitrogen concentration in thin films formed using an initial set of process parameters and any necessary adjustments are made. Once SIMS testing confirms that the established process parameters yield the desired nitrogen concentration, the process is used in high-volume production and the nitrogen concentration is assumed to remain at the desired level. Thereafter, the SIMS testing is repeated only about every six months to confirm that the nitrogen concentration is still at the desired level.

In practice, however, changed circumstances may cause the nitrogen concentration to vary unexpectedly. For example, if the nitrogen source runs out, then one or more lots of wafers may be produced with gate oxides that do not include nitrogen. As discussed above, such gate oxides are undesirable because they have a relatively short hot carrier lifetime and materials, e.g., boron, can diffuse therethrough into the channel area of the gate. On the other hand, if something happens that causes too much nitrogen to be introduced into the furnace, then the excess nitrogen may spread into the channel and degrade the conduction therein. In either scenario, the potential exists for thousands of dollars of wafers to be ruined before the problem is discovered.

In view of the foregoing, there is a need for a method that enables the concentration of nitrogen in a film of nitrided oxide material to be monitored quickly and inexpensively in a fab environment.

SUMMARY OF THE INVENTION

Broadly speaking, the present invention fills this need by providing a method for determining the nitrogen concentration in a film of nitrided oxide material based on an optical property of the film. The method enables the nitrogen concentration in films of nitrided oxide material formed during the production of semiconductor devices to be monitored in the fab environment.

In accordance with one aspect of the present invention, a method for determining the nitrogen concentration in a film of nitrided oxide material formed over a semiconductor wafer during fabrication of a semiconductor device is provided. In this method an optical property, e.g., extinction coefficient, k, of the film of nitrided oxide material is first determined. The determined optical property is then used to determine the nitrogen concentration in the film of nitrided oxide material.

In one embodiment of the invention, the oxide material is silicon dioxide and the optical property of the film that is determined is the extinction coefficient, k. In this embodiment the operation of determining the optical property of the film of nitrided oxide material includes applying ultraviolet light to the film of nitrided oxide material, detecting the light reflected by the film of nitrided oxide material to obtain a relative amount of reflected light, and calculating the optical property using the relative amount of reflected light. Further, the operation of using the optical property to determine the nitrogen concentration includes determining a correlation between the optical property and measured nitrogen concentrations in sample films of nitrided oxide material over a range of nitrogen concentrations, and correlating the determined optical property to obtain the nitrogen concentration in the film of nitrided oxide material. The measured nitrogen concentrations in the sample films of nitrided oxide material may be obtained by secondary ion mass spectroscopy (SIMS).

In accordance with another aspect of the present invention, a method for making a semiconductor device is provided. In this method a film of nitrided oxide material is formed over a plurality of semiconductor wafers in a fab. The nitrogen concentration in the film of nitrided oxide material is monitored by periodically subjecting one of the wafers to an in-line test in the fab. This in-line test preferably includes the method operations described above in connection with the method for determining the nitrogen concentration in a film of nitrided oxide material of the present invention.

The present invention provides a method that enables the nitrogen concentration in a film of nitrided oxide material to be determined by determining an optical property of the film. This method is advantageous because it is inexpensive, nondestructive, and capable of mapping an entire wafer. Furthermore, this method can be implemented in a fab environment as an in-line test to monitor the nitrogen concentration in films of nitrided oxide material on a regular, e.g., lot-by-lot, basis during the production of semiconductor devices. Through such in-line testing, any deviation from the desired concentration range can be detected promptly and appropriate corrective action can be taken before a significant number of wafers is affected.

It is to be understood that the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION OF THE PREFERRED EMBODIMENTS

Figure 1:
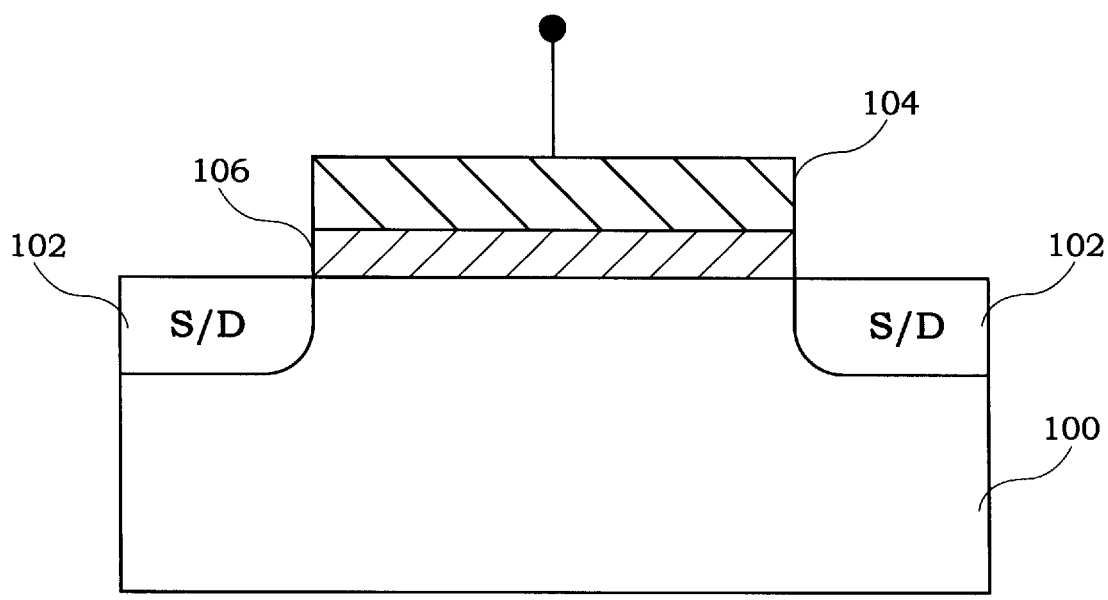
FIG. 1 is a schematic cross-section of a conventional MOS transistor.

The present preferred embodiments of the invention will now be described in detail with reference to the accompanying drawings. FIG. 1 is discussed above in the "Background of the Invention" section.

The present invention provides a method that enables the concentration of nitrogen in a film of nitrided oxide material to be monitored quickly and inexpensively in a fab environment. The development of this method was spurred by the hypothesis that the nitrogen concentration in a film of nitrided oxide material may be ascertainable by analyzing the difference between the optical properties of pure silicon dioxide ($SiO_2$) and the optical properties of a combination of silicon dioxide and silicon nitride ($Si_3N_4$). To this end, the development of the method of the present invention began with an examination of the optical properties of silicon dioxide and silicon nitride.

Figure 2:
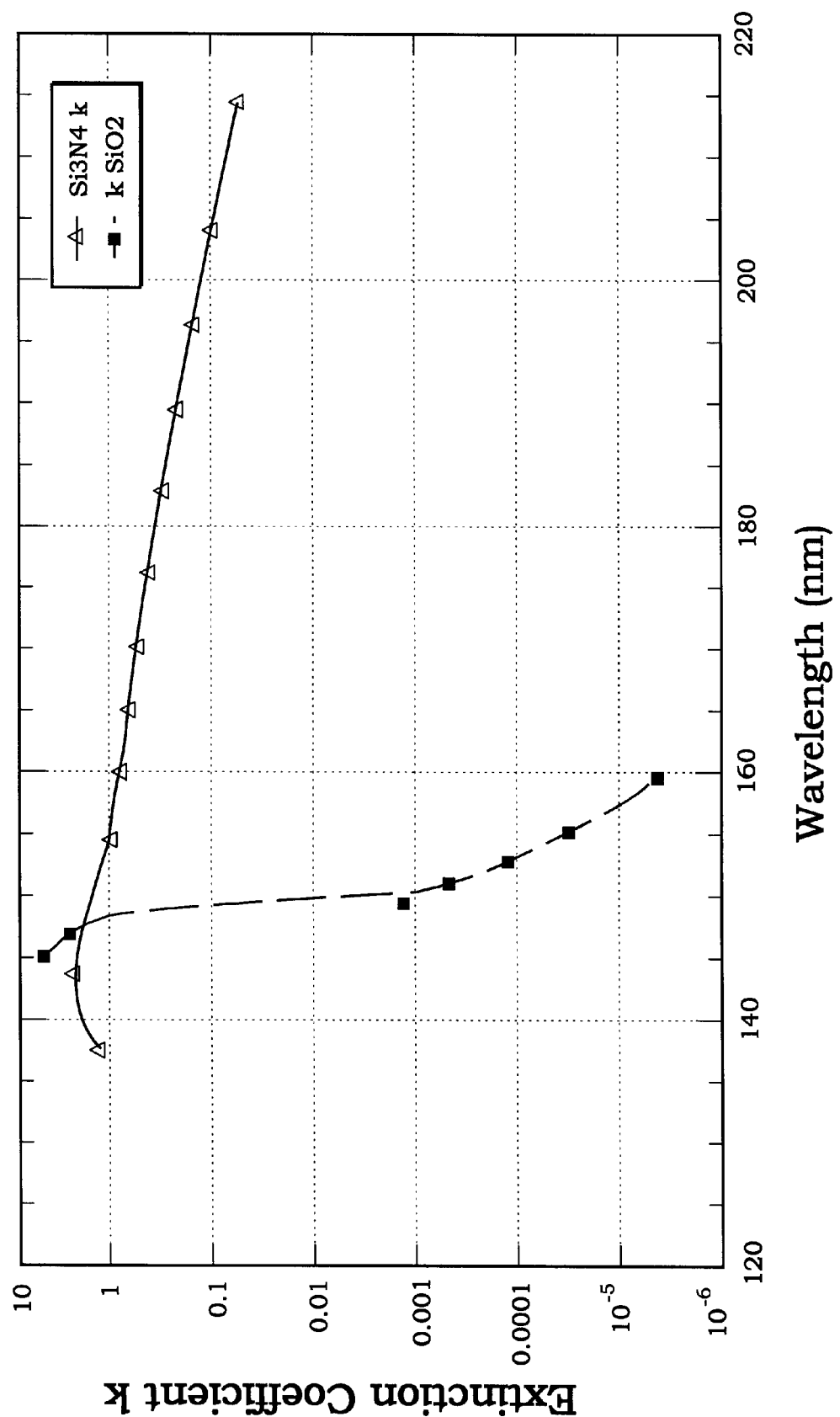
FIG. 2 is a graph showing the extinction coefficients, k, for silicon dioxide and silicon nitride over a range of ultraviolet (UV) wavelengths.

FIG. 2 is a graph showing the extinction coefficients, k, for silicon dioxide and silicon nitride over a range of ultraviolet (UV) wavelengths. The data points shown in FIG. 2 are taken from the *Handbook of Optical Constants of Solids,* edited by Edward D. Palik, Academic Press (1985), ISBN: 0-12-544420-6. As shown in FIG. 2, as the wavelength moves into the deep UV range, the extinction coefficient for silicon dioxide drops off dramatically to essentially zero. In other words, silicon dioxide is virtually transparent to light having a wavelength in the UV range. In contrast, as the wavelength moves into the deep UV range, the extinction coefficient for silicon nitride remains relatively flat, with the k value at about 160 nm being about 5 times higher than the k value at about 200 nm. Accordingly, silicon nitride absorbs light having a wavelength in the UV range.

The data shown in FIG. 2 demonstrates that silicon dioxide and silicon nitride have different optical properties in the deep UV range. Accordingly, an experiment was conducted to determine whether this difference in optical properties could be used to determine the concentration of nitrogen in a film of nitrided oxide material. In this experiment thin films of nitrided silicon dioxide were grown over 5 pairs of wafers, with each pair of wafers being produced using a different NO flow rate added to 5 standard liters/minute (slm) of $N_2$ at 850° C. for 30 minutes. The nitrogen concentration in one set of wafers was determined by scanning ion mass spectroscopy (SIMS). The other set of wafers was tested with an n & k Analyzer 1500, which is available from n & k Technology, Inc. of Santa Clara, Calif., to determine the extinction coefficient, k, of each film of nitrided oxide material. The extinction coefficient of the nitrided oxide material was calculated using a two-film model on silicon. In particular, the model was a silicon dioxide film of known optical properties on top of a film of variable optical properties.

Figure 3:
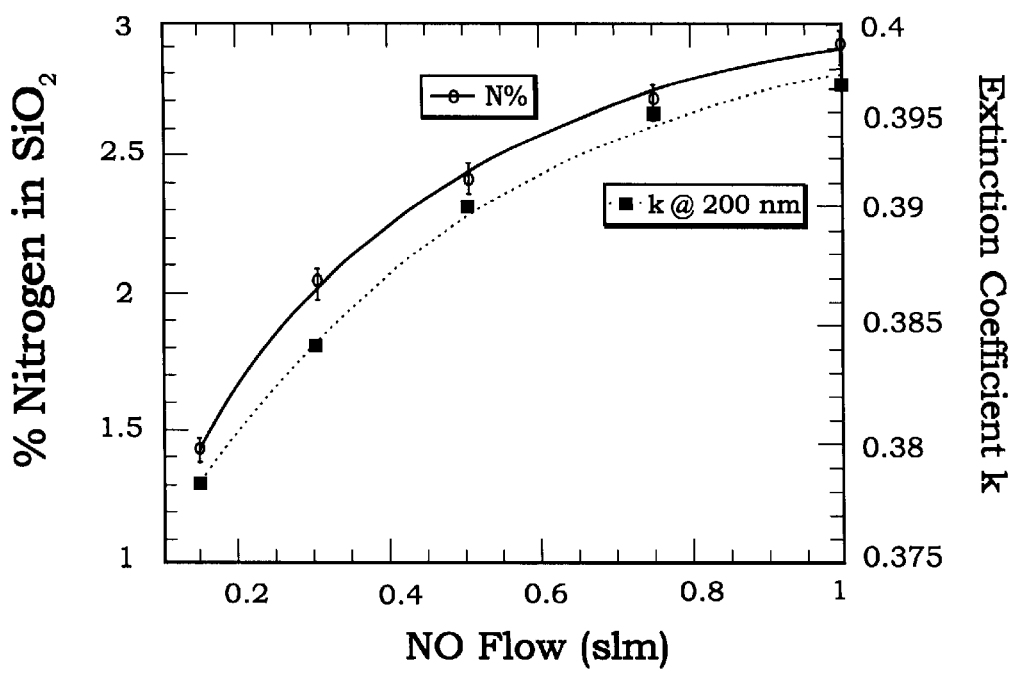
FIG. 3 is a graph showing the atomic percentage of nitrogen in silicon dioxide determined by SIMS (the curve indicated with a solid line) and the extinction coefficient, k, at 200 nm (the curve indicated with a dashed line) as a function of the NO flow rate added to 5 standard liters/minute (slm) of $N_2$ at 850° C. for 30 minutes.

The results of these tests are shown in FIG. 3, which is a graph showing two curves. The curve shown in FIG. 3 with a solid line shows the atomic percentage of nitrogen in silicon dioxide determined by SIMS as a function of the NO flow rate. The curve shown in FIG. 3 with a dashed line shows the extinction coefficient, k, at 200 nm determined by the n & k Analyzer 1500 as a function of the NO flow rate. As shown in FIG. 3, the extinction coefficient, k, increases as the nitrogen concentration in the nitrided film increases. The reason for this increase is believed to be that the presence of Si—N bonds in the nitrided oxide film causes a non-zero extinction coefficient.

Figure 4:
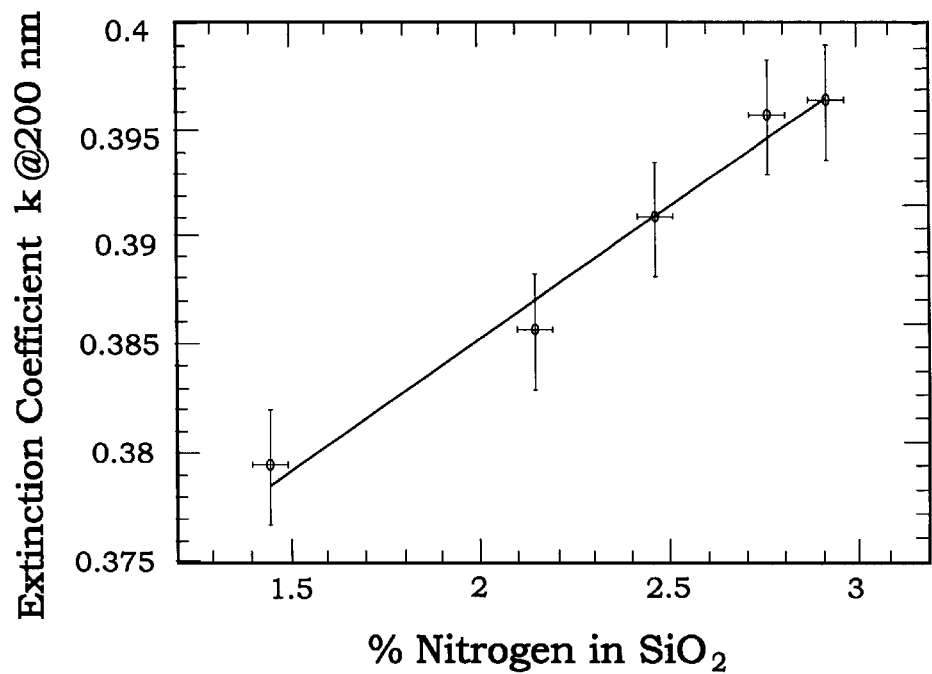
FIG. 4 is a graph showing the extinction coefficient, k, at 200 nm as a function of the atomic percentage of nitrogen in silicon didioxide determined by SIMS.

FIG. 4 is a graph showing the extinction coefficient, k, at 200 nm as a function of the atomic percentage of nitrogen in silicon dioxide determined by SIMS. As shown in FIG. 4, the relationship between the extinction coefficient and the nitrogen concentration is linear. Thus, by virtue of this relationship, the nitrogen concentration in a nitrided oxide film may be determined in a fab environment. As will be explained in more detail below, one way to make this determination is by calibrating the extinction coefficient with samples measured by SIMS, measuring the extinction coefficient in the fab environment, and correlating the measured extinction coefficient to obtain the nitrogen concentration.

Figure 5:
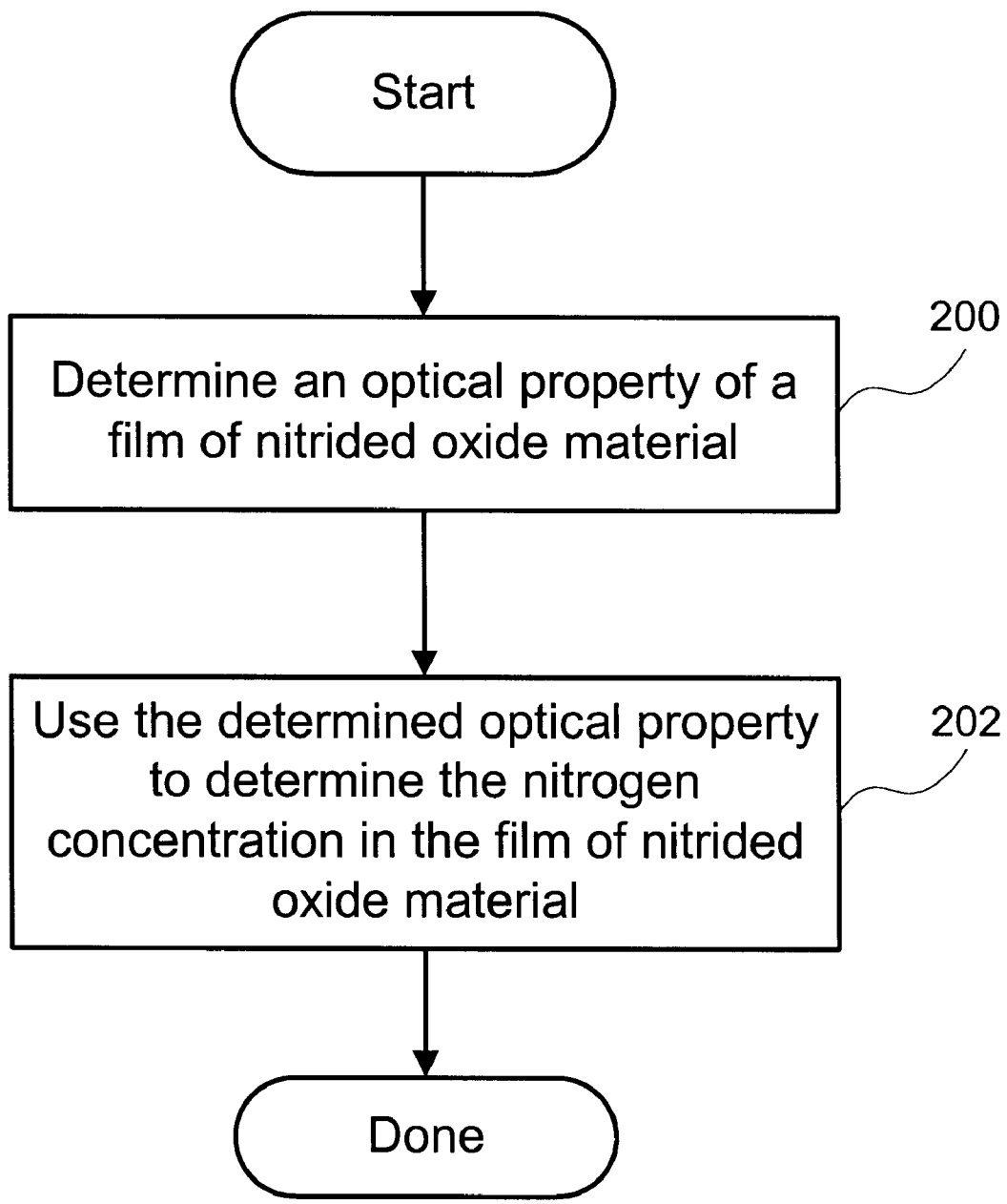
FIG. 5 is a flowchart diagram illustrating the method operations performed in determining the nitrogen concentration in a film of nitrided oxide material formed over a semiconductor wafer during fabrication of a semiconductor device in accordance with one embodiment of the present invention.

FIG. 5 shows a flowchart diagram illustrating the method operations performed in determining the nitrogen concentration in a film of nitrided oxide material formed over a semiconductor wafer during fabrication of a semiconductor device in accordance with one embodiment of the present invention. The method begins in operation 200 in which an optical property of the film of nitrided oxide material is determined. The optical property, e.g., extinction coefficient, k, may be determined with a suitable measuring tool, e.g., the n & k Analyzer 1500. The method by which such measuring tools determine optical properties such as the extinction coefficient, k, is described in detail in U.S. Pat. No. 4,905,170 to Forouhi et al., the disclosure of which is incorporated herein by reference. Generally speaking, however, the measuring tool first applies light to the film of nitrided oxide material. The tool then detects the light reflected by the film of nitrided oxide material to obtain a relative amount of reflected light. Finally, the tool calculates the optical property using the relative amount of reflected light.

In operation 202, the determined optical property is used to determine the nitrogen concentration in the film of nitrided oxide material. In one embodiment of the invention, a correlation between the optical property and measured nitrogen concentrations in sample films of nitrided oxide material over a range of nitrogen concentrations is first determined. The nitrogen concentrations in the sample films may be measured by SIMS. The determined optical property is then correlated to obtain the nitrogen concentration in the film of nitrided oxide material. Once the nitrogen concentration is determined, the method is done.

In the exemplary embodiment of the invention described herein, the extinction coefficient, k, was measured with the n & k Analyzer 1500 at a wavelength of 200 nm. This wavelength was used because it optimizes the performance of the n & k Analyzer 1500. If another measuring tool is used, then it may be desirable to measure the extinction coefficient, k, at a different wavelength. In this regard, it will be apparent to those skilled in the art from the data shown in FIG. 2 that the extinction coefficient, k, may be measured at wavelengths in the range from about 160 nm to about 220 nm.

Figure 6:
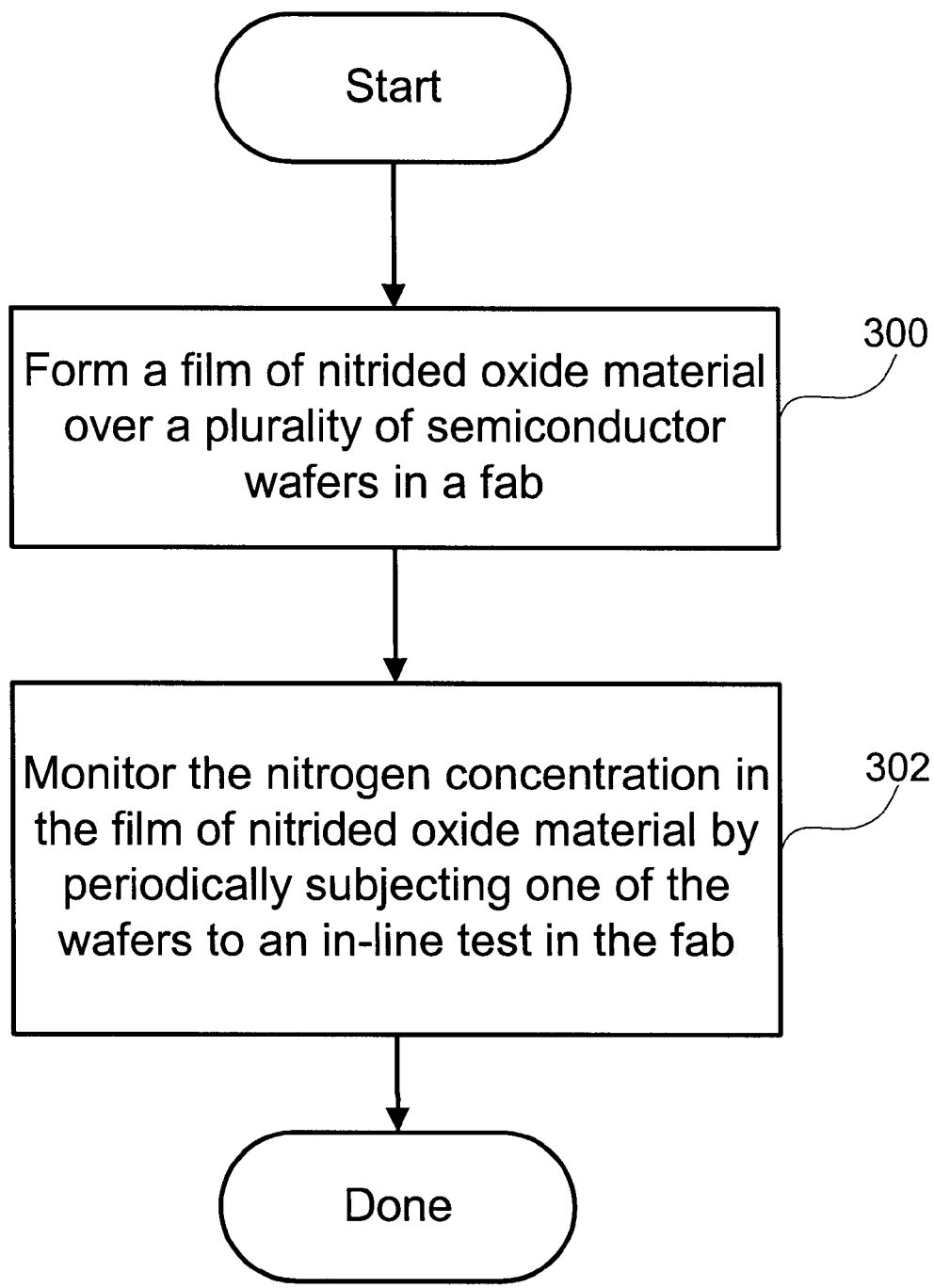
FIG. 6 is a flowchart diagram illustrating the method operations performed in making a semiconductor device in accordance with another embodiment of the present invention.

FIG. 6 shows a flowchart diagram illustrating the method operations performed in making a semiconductor device in accordance with another embodiment of the present invention. The method begins in operation 300 in which a film of nitrided oxide material is formed over a plurality of semiconductor wafers in a fab. In cases where the film forms the gate oxide of a transistor, the film may be formed by growing a thin film of nitrided silicon dioxide on the surface of a silicon wafer. As is well known to those skilled in the art, this may be accomplished by sending the wafers through a furnace having an atmosphere that contains a suitable nitric species, e.g., $N_2$, $NH_3$, $N_2O$, and NO. By way of example, nitrided gate oxides for 0.25 $\mu$m and 0.20 $\mu$m generation CMOS transistors, which typically have a thickness of about 50 angstroms, may contain about 1 atomic % to about 4 atomic %, and preferably about 2 atomic % to about 3 atomic %, of nitrogen in the silicon dioxide.

In operation 302 the nitrogen concentration in the film of nitrided oxide material is monitored by periodically subjecting one of the wafers to an in-line test in the fab. The in-line test preferably determines the nitrogen concentration in the film of nitrided oxide material using the method operations described above. To implement the in-line test, a measuring tool such as, for example, the n & k Analyzer 1500, may be set up in the fab. This tool may then be used to monitor the nitrogen concentration in the films of nitrided oxide material by testing the wafers on a regular basis, e.g., one wafer per lot. As explained in detail above, the measuring tool determines an optical property, e.g., the extinction coefficient, k, of the film of nitrided oxide material. The determined optical property is then used to determine the nitrogen concentration in the film of nitrided oxide material. Once the nitrogen concentration is determined, the method is done.

In one embodiment of the method of making a semiconductor device of the invention, two sets of wafers having films of nitrided silicon dioxide with varying nitrogen concentrations formed thereover are first prepared. For one set of wafers the nitrogen concentration in each of the nitrided silicon dioxide films is determined by SIMS. For the other set of wafers the extinction coefficient, k, for each of the nitrided silicon dioxide films is determined with a suitable measuring tool, e.g., the n & k Analyzer 1500. The results are then analyzed to determine the correlation between the measured extinction coefficient, k, and the nitrogen concentration determined by SIMS. During commercial production, the nitrogen concentration in the films of nitrided silicon dioxide is monitored in the fab environment on a regular basis by determining the extinction coefficient, k, of the film and correlating the determined k value to obtain the nitrogen concentration. By testing at least one wafer per lot, the nitrogen concentration in the commercially produced films can be monitored on a lot-by-lot basis. It will be apparent to those skilled in the art that the frequency with which the nitrogen concentration is monitored may be adjusted to meet the needs of the particular situation.

Those skilled in the art will recognize that the method for determining the nitrogen concentration in a film of nitrided oxide material of the present invention provides a number of significant advantages relative to the prior art. In particular, the method of the present invention is inexpensive, nondestructive, and capable of mapping an entire wafer. Furthermore, this method can be implemented in a fab environment as an in-line test to monitor the nitrogen concentration in nitrided oxide films on a regular, e.g., lot-by-lot, basis during the production of semiconductor devices. Through such in-line testing, any deviation from the desired concentration range can be detected promptly and appropriate corrective action to be taken before a significant number of wafers is affected.

In summary, the present invention provides a method for determining the nitrogen concentration in a film of nitrided oxide material by determining an optical property of the film. The invention has been described herein in terms of several preferred embodiments in which the optical property is the extinction coefficient, k. Other embodiments of the invention will be apparent to those skilled in the art from consideration of the specification and practice of the invention. For example, a different optical property, e.g., the index of refraction, may be used to determine the nitrogen concentration in the film. The embodiments and preferred features described above should be considered exemplary, with the invention being defined by the appended claims.

What is claimed is:

1. A method for determining a nitrogen concentration in a film of nitrided oxide material formed over a semiconductor wafer during fabrication of a semiconductor device, comprising:

determining an optical property of the film of nitrided oxide material; and using the determined optical property to determine the nitrogen concentration in the film of nitrided oxide material.

2. The method of claim 1, wherein the operation of determining the optical property of the film of nitrided oxide material comprises:

applying light to the film of nitrided oxide material;

detecting the light reflected by the film of nitrided oxide material to obtain a relative amount of reflected light; and calculating the optical property using the relative amount of reflected light.

3. The method of claim 2, wherein the optical property is an extinction coefficient, k, and the light applied to the film of nitrided oxide material is ultraviolet light.

4. The method of claim 1, wherein the operation of using the determined optical property to determine the nitrogen concentration in the film of nitrided oxide material comprises:

determining a correlation between the optical property and measured nitrogen concentrations in sample films of nitrided oxide material over a range of nitrogen concentrations; and correlating the determined optical property to obtain the nitrogen concentration in the film of nitrided oxide material.

5. The method of claim 4, wherein the measured nitrogen concentrations in the sample films of nitrided oxide material are obtained by secondary ion mass spectroscopy.

6. The method of claim 1, wherein the film of nitrided oxide material consists essentially of silicon dioxide and about 1 atomic % to about 4 atomic % of nitrogen.

7. A method for determining a nitrogen concentration in a film of nitrided oxide material formed over a semiconductor wafer during fabrication of a semiconductor device, comprising:

determining an extinction coefficient, k, of the film of nitrided oxide material; and using the determined extinction coefficient to determine the nitrogen concentration in the film of nitrided oxide material.

8. The method of claim 7, wherein the operation of determining the extinction coefficient of the film of nitrided oxide material comprises:

applying ultraviolet light to the film of nitrided oxide material;

detecting the ultraviolet light reflected by the film of nitrided oxide material to obtain a relative amount of reflected ultraviolet light; and calculating the extinction coefficient using the relative amount of reflected ultraviolet light.

9. The method of claim 8, wherein the ultraviolet light reflected by the film of nitrided oxide material is detected at a wavelength in a range from about 160 nanometers to about 220 nanometers.

10. The method of claim 7, wherein the operation of using the determined extinction coefficient to determine the nitrogen concentration in the film of nitrided oxide material comprises:

determining a correlation between the extinction coefficient and measured nitrogen concentrations in sample films of nitrided oxide material over a range of nitrogen concentrations; and correlating the determined extinction coefficient to obtain the nitrogen concentration in the film of nitrided oxide material.

11. The method of claim 10, wherein the measured nitrogen concentrations in the sample films of nitrided oxide material are obtained by secondary ion mass spectroscopy.

12. The method of claim 7, wherein the extinction coefficient is determined at a wavelength in a range from about 160 nanometers to about 220 nanometers.

13. The method of claim 7, wherein the extinction coefficient is determined at a wavelength of about 200 nanometers.

14. The method of claim 7, wherein the film of nitrided oxide material consists essentially of silicon dioxide and about 1 atomic % to about 4 atomic % of nitrogen.

15. A method of making a semiconductor device, comprising:

forming a film of nitrided oxide material over a plurality of semiconductor wafers in a fab; and monitoring a nitrogen concentration in the film of nitrided oxide material by periodically subjecting one of the wafers to an in-line test in the fab, wherein the in-line test comprises:

determining an optical property of the film of nitrided oxide material; and using the determined optical property to determine the nitrogen concentration in the film of nitrided oxide material.

16. The method of claim 15, wherein the film of nitrided oxide material forms a gate of a transistor.

17. The method of claim 15, wherein the operation of determining the optical property of the film of nitrided oxide material comprises:

applying light to the film of nitrided oxide material;

detecting the light reflected by the film of nitrided oxide material to obtain a relative amount of reflected light; and calculating the optical property using the relative amount of reflected light.

18. The method of claim 17, wherein the optical property is an extinction coefficient, k, and the light applied to the film of nitrided oxide material is ultraviolet light.

19. The method of claim 15, wherein the operation of using the determined optical property to determine the nitrogen concentration in the film of nitrided oxide material comprises:

determining a correlation between the optical property and measured nitrogen concentrations in sample films of nitrided oxide material over a range of nitrogen concentrations; and correlating the determined optical property to obtain the nitrogen concentration in the film of nitrided oxide material.

20. The method of claim 19, wherein the measured nitrogen concentrations in the sample films of nitrided oxide material are obtained by secondary ion mass spectroscopy.

21. The method of claim 15, wherein the film of nitrided oxide material consists essentially of silicon dioxide and about 1 atomic % to about 4 atomic % of nitrogen.

22. A semiconductor device formed by the method of claim 15.

* * * * *